United States Patent [19]

Wada

[11] Patent Number: 5,047,972
[45] Date of Patent: Sep. 10, 1991

[54] DIGITAL SIGNAL PROCESSOR WITH MEMORY HAVING DATA SHIFT FUNCTION

[75] Inventor: Hirohumi Wada, Ohme, Japan

[73] Assignee: Hitachi, Ltd., Tokyo, Japan

[21] Appl. No.: 498,332

[22] Filed: Mar. 23, 1990

Related U.S. Application Data

[62] Division of Ser. No. 184,242, Apr. 21, 1988, Pat. No. 4,959,815.

[30] Foreign Application Priority Data

Apr. 24, 1987 [JP] Japan .................................. 62-99778

[51] Int. Cl.[5] ............................................. G06F 15/31
[52] U.S. Cl. .......................... 364/724.16; 364/715.08; 365/189.01
[58] Field of Search ...................... 364/724.16, 715.08; 365/230.06, 189.01

[56] References Cited

U.S. PATENT DOCUMENTS

| | | | |
|---|---|---|---|
| 4,025,772 | 5/1977 | Constant | 364/728.01 |
| 4,339,803 | 7/1982 | Michael et al. | 364/724.19 |
| 4,561,065 | 12/1985 | Matsuda | 364/724.17 |
| 4,754,435 | 6/1988 | Takamatsu | 365/230 |
| 4,773,048 | 9/1988 | Kai | 365/230 |
| 4,773,049 | 9/1988 | Takemae | 365/230 X |
| 4,809,208 | 2/1989 | Hansen et al. | 364/724.12 |

OTHER PUBLICATIONS

"Hitachi Digital Signal Processor (HSP) HD61810 User's Manual", Hitachi, Ltd., Sep. 1985, pp. 1-24. (English translation provided).

Primary Examiner—David H. Malzahn
Attorney, Agent, or Firm—Fay, Sharpe, Beall, Fagan, Minnich & McKee

[57] ABSTRACT

This invention relates to a digital signal processor equipped with a RAM having the functions of reading memory from a first address and outputting it to a predetermined bus and writing the memory into a second address designated in the same memory cycle in order to make product/sum calculation necessary for filter calculation.

9 Claims, 9 Drawing Sheets

DIGITAL SIGNAL PROCESSOR WITH MEMORY HAVING DATA SHIFT FUNCTION

This is a divisional of copending application(s) Ser. No. 07/184,242 filed on Apr. 21, 1988, now U.S. Pat. No. 4,959,815.

BACKGROUND OF THE INVENTION

This invention relates to a digital signal processor. For example, the present invention relates to a technique which will be effective for use in a digital signal processor or the like having a product/sum calculation function necessary for accomplishing equivalently a digital filter.

A digital signal processor with built-in control ROM (Read-Only Memory), data ROM and data RAM (Random Access Memory) of a stored program system is known. When a transversal type digital flter is accomplished by such a digital signal processor, for example, the product/sum calculation such as represented by the flowchart of FIG. 10 must be repeatedly executed in every sampling period and the sampling data must be delayed by one sampling period for the next product/sum calculation.

A digital sgnal processor having the structure such as shown in FIG. 11 has been proposed in order to execute the product/sum calculation described above at a high speed. The sampling data Xi read from the RAM is applied to one of the input terminals of a multiplication circuit MULT. This data is placed on the Y-BUS when selected by a bus selection circuit SELO. The filter coefficient Ci is read from the ROM and inputted to the other input terminal of the multiplication circuit MULT through an X-BUS. The result of the multiplication (product) is applied to one of the input terminals of an arithmetic and logic unit ALU. The output signal of an accumulator, which holds the result of the previous calculation (sum) of the arithmetic and logic unit, is applied to the other of the input terminals of the arithmetic and logic unit ALU. In this digital signal processor, the sampling data Xi and the filter coefficient Ci are inputted sequentially to the multiplication circuit and the product/sum calculation of the following equation which is necessary for the filter calculation and is shown in FIG. 10 can be accomplished at a high speed:

$$Qn = \sum_{i=1}^{n} Xi \cdot Ci$$

Furthermore, a delay register DREG for holding the sampling data read from the RAM for one sampling period is disposed in this digital signal processor. After the read operation of the next sampling data Xi+1 is made, the sampling data Xi read from the RAM is written into its address "i+1". In this manner, the shift operation of the sampling data necessary for the next filter calculation is executed automatically without relying upon program control as shown in FIG. 10.

The digital signal processor having the product/sum calculation function and the sampling data shift function is described in, for example, "Hitachi Digital Signal Processor (HSP) HD61810 Users' Manual" published by Hitachi, Ltd., September, 1985.

SUMMARY OF THE INVENTION

The digital signal processor described in the prior art reference mentioned above is effective for executing the product/sum calculation necessary for filter calculation at a high speed and for reading out the sampling data simultaneously with the shifting operation of the sampling data. The prior art has the following two limitations.

The sampling data held by the delay register DREG is written after the sampling data of the next address is read out. Therefore, the delay register DREG needs a latch having a two-stage structure consisting of a plurality of bits that correspond to the bit number of the sampling data. For this reason, more hardware is necessary and the cost of production is increased. Since the write operation of the sampling data previously read occurs after the read operation of the sampling data is complete, the logic level of the data line and sense amplifier changes twice within one memory cycle, respectively. Accordingly, the overall access time increases as the memory size increases and this degrades the machine cycle speed of the digital signal processor.

It is therefore a primary object of the present invention to provide a digital signal processor which can attain a faster machine cycle speed while r[-ducing the cost of production.

The above and other objects and novel features of the present invention will beome more obvious from the following description when taken in conjunction with the aooompanying drawings.

Among the inventions disclosed in this specification, the following will illustrate a typical invention. A product/sum calculation hecessary for filter calculation is performed and after the read operation of sampling data from the RAM is complete, the product/sum result is outputted to a bus and is then written into the next address to be shifted.

The means described above eliminates the necessity of a delay register for holding the sampling data in one memory cycle of the RAM and can execute the read operation of the sampling data and its shifting operation without changing the logic level of the data line. Therefore, the product/sum calculation necessary for the filter brocessing can be repeated at a high speed and the cost of production can be reduced by eliminating the delay register, and the like.

DESCRIPTION OF THE PREFERRED EMBODIMENTS

Figure 1:
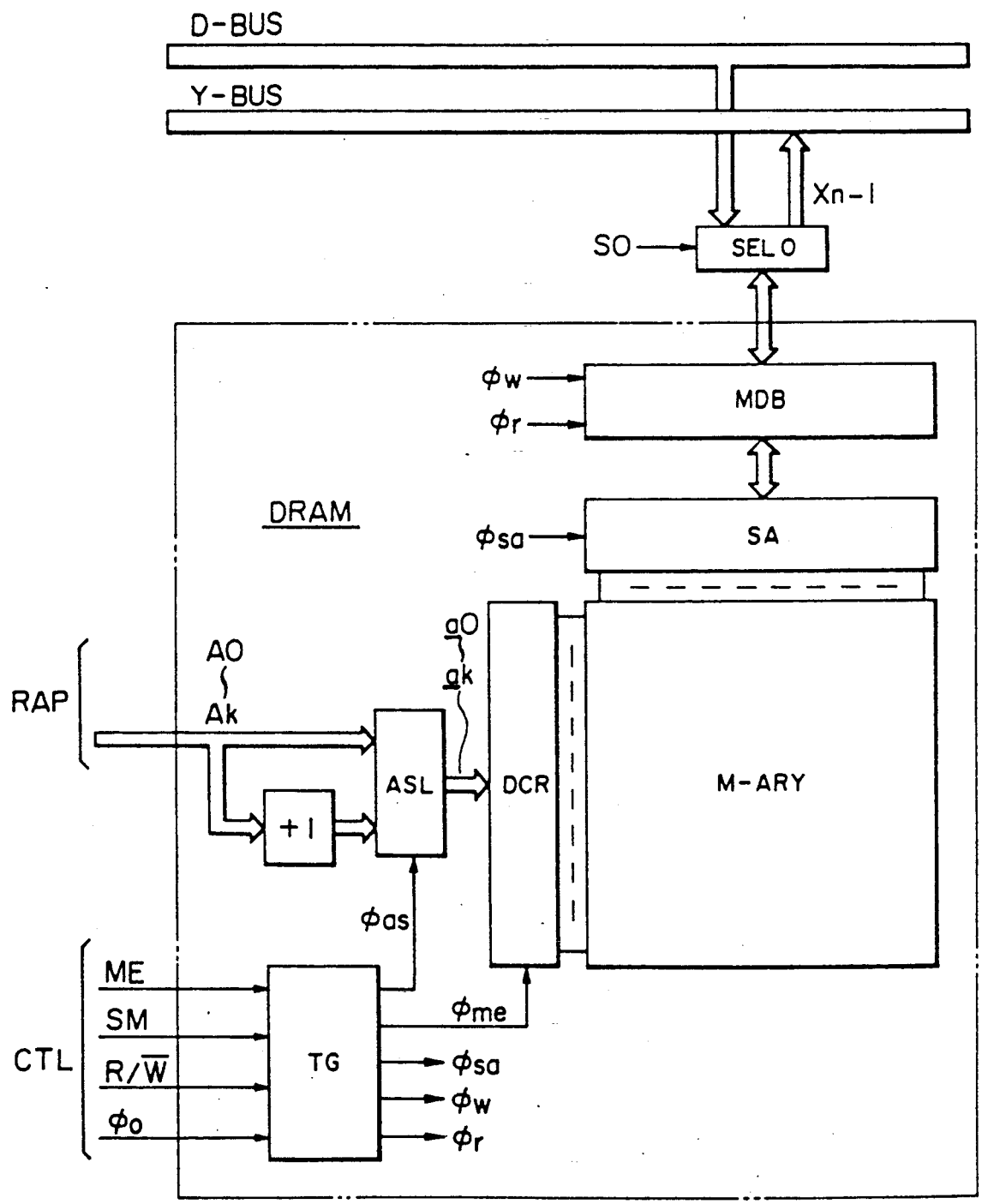
FIG. 1 is a block diagram showing the RAM of a digital signal processor in accordance with one embodiment of the present invention.

FIG. 1 is a block diagram showing one example of the digital signal processor to which the present invention is applied. Circuit devices constituting each circuit block of this drawing are formed by known fabrication technique of integrating semiconductor circuits on one semiconductor substrate such as single crystal silicon, through not particularly limited thereto.

The digital signal processor of this embodiment is a signal processor which utilizes a stored program system consisting of a microprogram, though not particularly limited thereto, and its operation is controlled by microinstructions stored in an instruction ROM (IROM).

Though not particularly, limitative, the digital signal processor of this embodiment includes a RAM for temporarily storing sampling data and the like and a ROM for storing fixed data such as filter coefficients.

Figure 9:
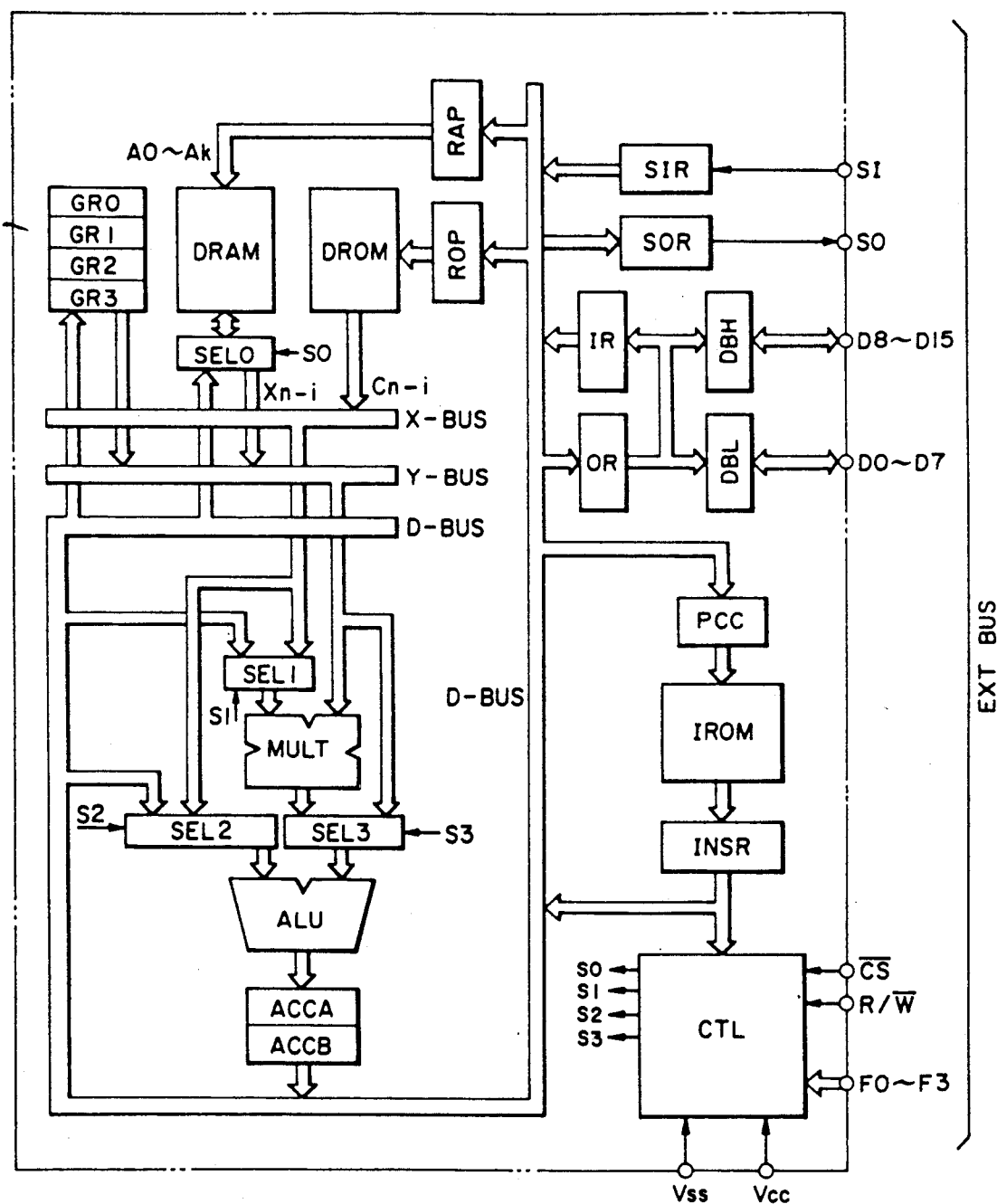
FIG. 9 is a block diagram showing one embodiment of a digital signal processor containing the RAM shown in FIG. 1.
Figure 10:
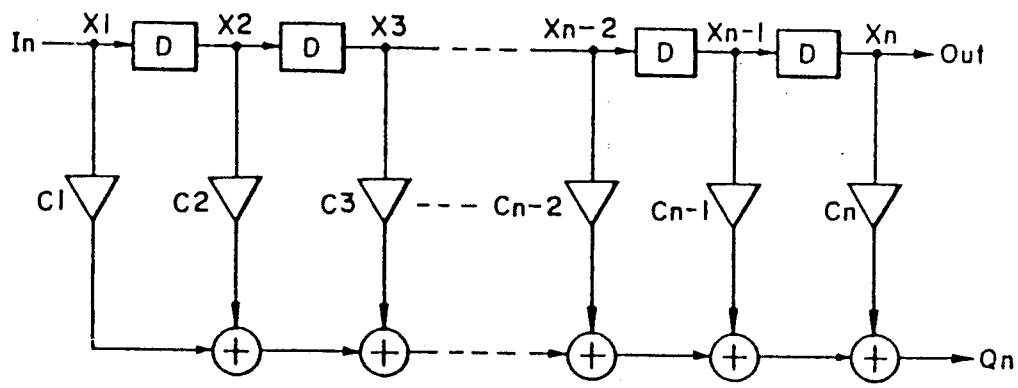
FIG. 10 is a block diagram showing one example of conventional digital signal-processors.
Figure 11:
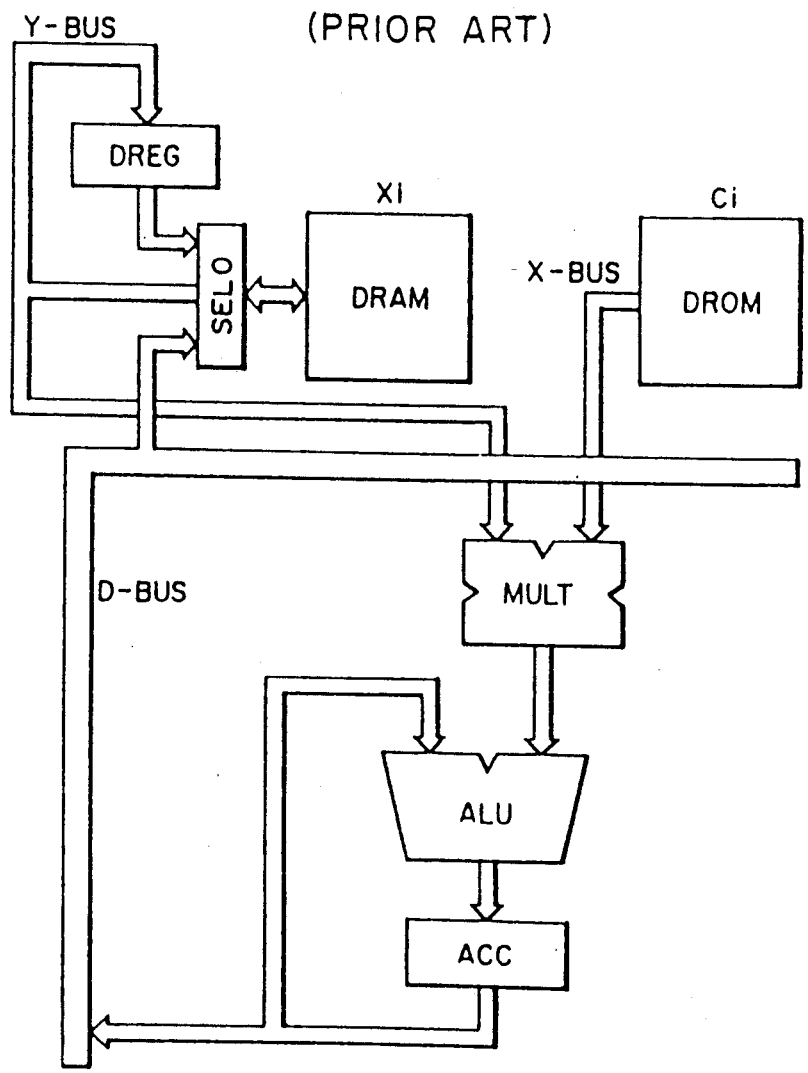
FIG. 11 is a block diagram showing another example of the conventional digital signal processors.

In FIG. 9, since the input/output terminal of the RAM is common, the RAM is controlled by a bus selection signal from a later appearing control circuit CTL. A bus selection circuit SEL0 selects the buses corresponding to the input and the output, respectively. The address of the RAM is designated by an address pointer RAP. The sampling $X_{n-i}$ and the like read from the RAM are applied to one of the input terminals of a multiplication circuit MULT or to a bus selection circuit SEL3 through a Y-BUS which is selected at the time of the output of the RAM.

The ordinary write data is supplied to the RAM through the data bus D-BUS and the but selection circuit SEL0. As will be described elsewhere, this RAM has the function of shifting the sampling data automatically. This function is accomplished by writing the sampling data to the corresponding address of the next sampling period, while substantially simultaneously performing the read operation for the product/sum computation that is necessary for the filter calculation, for example.

The definite construction of the RAM and the outline of its operation will be described elsewhere in further detail.

On the other hand, the address of the ROM is designated by an address pointer ROP The filter coefficients $C_{n-i}$ and the like that are read are supplied to one of the input terminals of the bus selection circuit SEL1 or to the bus selection circuit SEL2 through the X-BUS.

The bus selection circuits SEL1–SEL3 are controlled by the bus selection signals S1–S3 of the later-appearing control circuit CTL. The filter coefficient $C_{n-1}$ or the like read from the ROM is supplied to one of the inputs of each of the bus selection circuits SEL1 and SEL2 through the X-BUS, and the output signal of the later-appearing accumulator ACCA or ACCB is supplied to the other input terminals through a data bus DBUS. The bus for the transfer of the computed data is selected by the selection signals S1, S2. The output signal of the bus selection circuit SEL1 is supplied to the other terminal of the MULT while the output signal of the bus selection circuit SEL2 is applied to one of the input terminals of the arithmetic and logic circuit ALU.

The sampling data $X_i$ or the like read from the RAM is supplied to one of the input terminals of the bus selection signal SEL3 through the selection circuit SEL0 and the Y-BUS. The result of MULT is applied to the other input terminal of SEL3. The bus selection signal S3 selects the data bus to provide the data for the calculation which is supplied to the other input terminal of the ALU.

The output terminals of 4-word general-purpose registers GR0—GR3 are connected to the Y-BUS. These general-purpose registers GR0-GR3 are used as the working registers and the input terminals are connected to the D-BUS.

As described already, the sampling $X_{n-i}$ or the like read from the RAM is supplied to one of the input terminals of the MULT through the Y-BUS. The filter coefficient $C_{n-i}$ or the like read from the ROM is supplied to the other input terminal of the MULT through the X-BUS which was selected by the bus selection circuit SEL1. The MULT multiplies each data sample by its corresponding filter coefficient and the result is sent to one of the input terminals of the bus selection circuit SEL3 as described already.

Alternatively, the data read from the RAM can be selected by the bus selecton circuit SEL3 and is directly applied to the input terminal of the ALU for the product/sum calculation. The output signal of the accumulator ACCA·ACCB is supplied to the other input terminal of the ALU through the D-BUS selected by the bus selecton circuit SEL2. Alternatively, data read from the ROM can be directly supplied to the ALU input terminal through the bus selection circuit SEL2 for the product/sum calculation. The ALU makes various calculations between these two sets of data and otuputs the result to the accumulators ACCA and ACCB.

The calculation from the MULT is supplied as one of the input signals to the ALU, and the result of the previous ALU calculation (sum), held by the accumulator ACCA·ACCB, is supplied to the other input terminal of the ALU. In this manner, the MULT and the ALU can compute the product and sum calculations of the sampling data and the filter coefficients within one machine cycle.

The details of the product/sum calculation method will be described later in further detail.

The address of the IROM is designated by the program counter PCC and the microinstruction read is supplied to the instruction register INSR. Though not particularly the value of the program counter PCC can be set through the external terminals D0-D15. The microinstruction held by the INSR is decoded by a plurality of decoders and each internal circuit of a digital signal processor, not shown in the drawing, is controlled in accordance with the microinstruction.

The control circuit CTL which includes the plurality of decoders described above, receives a predetermined part of the microinstruction held by the INSR and generates the timing signals necessary for each internal circuit as well as the bus selection signals S0–S3 for the bus selection circuits. The CTL receives a chip selection signal $\overline{CS}$, a read/write signal $R/\overline{W}$ and functonal code signals F0—F3 from an apparatus disposed outside the digital signal processor. The CTL uses these signals to generate the internal control and timings signals for controlling each circuit of the digital signal processor.

Contained in the microinstructions held by the INSR are the address signals supplied to the RAM address pointer RAp and to the ROM address pointer ROP through the D-BUS, respectively. These addresses select the sampling data from the RAM and the filter coefficients from the data ROM. The RAP and the ROP can function as up/down counters when the product/sum calculation processing for the filter calculation or the like must be repeated.

The digital signal processor inputs and outputs data in a parallel format to the external apparatus through the input register IR and the output register OR. The digital signal processor can also input and output data serially to the external apparatus through the serial input register SIR and the serial output register SOR.

The IR receives and holds the input data supplied in parallel format from the external apparatus through the external data terminals D0-D15 of the external bus EXT-BUS by way of the data buffers DBH and DBL. The IR sends the input data to the internal data bus D-BUS of the digital signal processor. The OR receives and holds the output data supplied through the internal data bus D-BUS. The OR sends the output data in parallel format through the data buffers DBH and DBL to the external data buses D0-D15. The SIR receives the input data serially supplied from the external apparatus through the serial input line SI in accordance with the clock signal, not shown. This serial data is then output in parallel to the D-BUS. The serial output register SOR receives parallel data from the D-BUS, converts it to serial data and then outputs it to the serial output line SO in accordance with the clock signal, not shown in the drawing.

The power supply voltage $V_{cc}$ and the ground potential Vss are supplied to each circuit from outside.

FIG. 1 is a block dagram showing one example of the RAM of the digital processor shown in FIG. 9. Though not particularly limited, the RAM of this embodiment operates in accordance with the fundamental clock signal $\phi_o$ supplied from the CTL and its memory cycle is defined by this fundamental clock signal $\phi_o$. The RAM is selected by the memory enable signal ME from the CTL. The operation of the RAM is determined by the address shift mode signal SM and the read/write signal R/$\overline{W}$ supplied from the CTL. Though not particularly limited, the address shift mode signal SM is at a low logic level for the normal read mode of the RAM, and at a high logic level for the sampling data read operation for the product/sum calculation In other words, when SM is at the high logic level, the RAM reads the sampling in the first portion of the memory cycle and writes the sampling data in the latter portion of the memory cycle The sampling data is written to the address corresponding to the next sampling period. To calculate the address, the RAM of this embodiment is provided with an incrementing circuit +1. The address selection circuit ASL selectively transmits one of the two addresses described above to the address decoder DCR.

The timing generation circuit TG shown in FIG. 1 generates the following various timing signals $\phi_{as}$, $\phi_{me}$, $\phi_{sa}$, $\phi_w$, $\phi_r$, and the like upon receipt of the signals ME, SM, R/$\overline{W}$ and $\phi_o$ described above.

In FIG. 1, the memory array M-ARY of the RAM consists of a plurality of word lines disposed in the horizontal direction of the drawing, a plurality of data lines disposed in the vertical direction and a plurality of memory cells disposed in matrix at the points of intersection of the word and lines, as will be described in further detail with reference to FIG. 2.

The word lines constituting the memory array M-ARY are connected to the DCR where one of them can be activated The k+1 bit complementary internal address signals a0-ak (non-inversed internal address signal a0 and inversed internal address signal $\overline{a0}$ are both represented by a0; and so forth) are supplied from the ASL to the DCR. The timing signal $\phi_{me}$ is supplied to the DCR from the TG.

The k+1 bit address signals A0-Ak supplied from the RAP are supplied to one set of the input terminals of the address selection circuit ASL and to the input terminal of the incrementing circuit +1. The incrementing circuit +1 calculates the address of the next sampling period by adding 1 to each address signal A0-Ak and supplies this address to the other set of input terminals of the ASL. Furthermore, the timing signal $\phi_{as}$ is supplied to the ASL from the TG.

A plurality of data lines within the memory array M-ARY are connected to corresponding unit sense amplifier circuits inside the sense amplifier SA and to corresponding unit buffer circuits inside the memory data buffer MDB. The timing signal $\phi_{sa}$ is supplied from the TG to the SA and the timing signals $\phi_w$ and $\phi_r$ are supplied to the MDB.

The memory buffer MDB is connected to the bus selection circuit SEL0 which is disposed between the DBUS and the Y-BUS. The bus selection signal SO is supplied from the control circuit CTL to this bus selection circuit SEL0.

Figure 2:
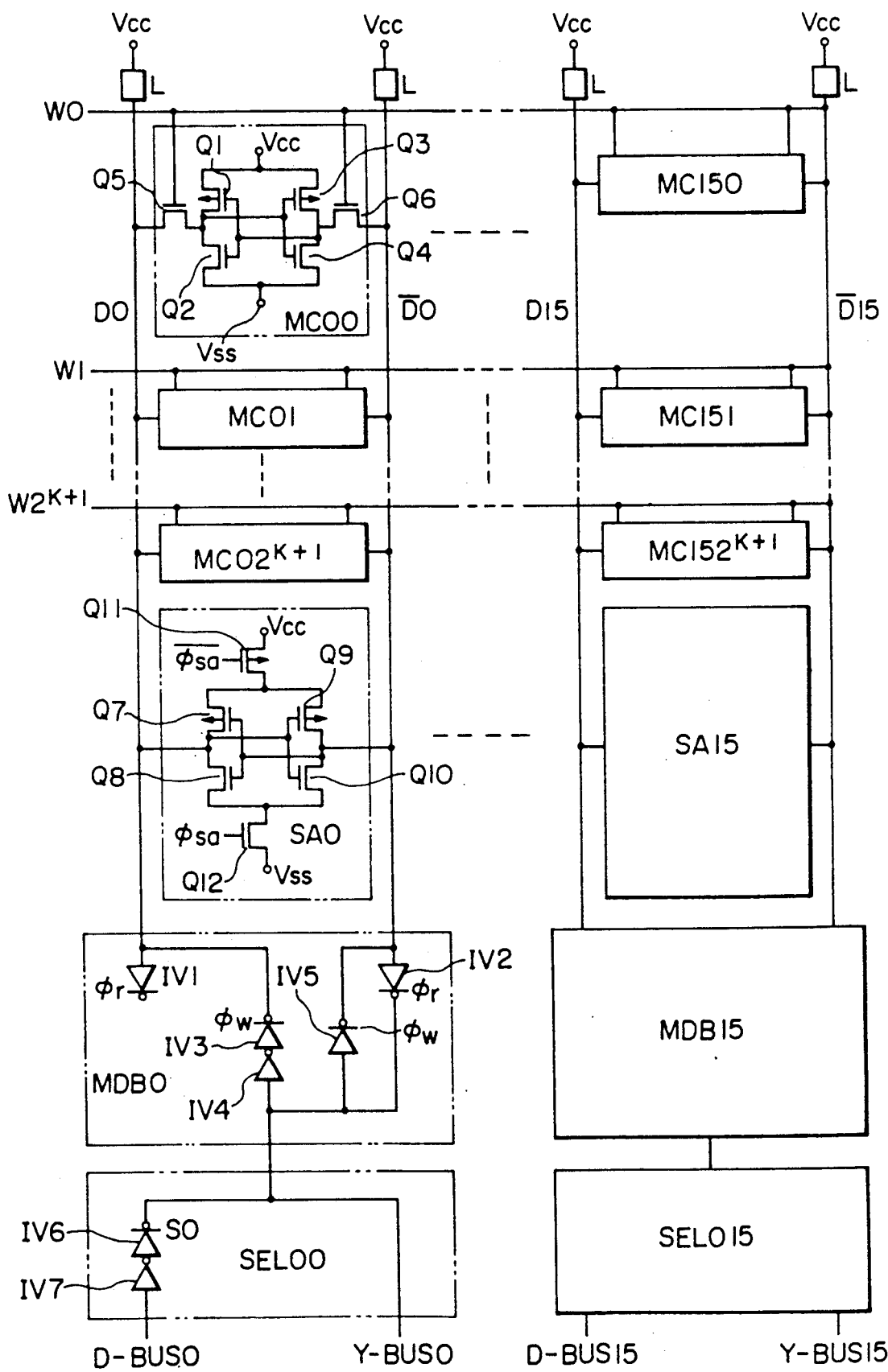
FIG. 2 is a circuit diagram showing in detail the memory array M-ARY, sense amplifier SA, data buffer MDB and bus selection circuit SELO of the RAM shown in FIG. 1.

FIG. 2 is a detailed view showing one example of the memory array M-ARY of the RAM, the sense amplifier SA, the memory buffer MDB and the bus selection circuit SEL0.

In FIG. 2, the M-ARY consists of a plurality of word lines W0-W$2^{k+1}$ disposed in the horizontal direction, a plurality of lines D0, $\overline{D0}$-D15, $\overline{D15}$ disposed in the vertical direction and a plurality of memory cells MC00-MC15($2^{k+1}$). Each memory cell consists of P-channel MOSFETs $Q_1$, $Q_3$ and N-channel MOSFETs $Q_2$, $Q_4$, $Q_5$, $Q_6$ which are disposed at the intersection between the word line and the data lines of the memory cell. The control terminals of the memory cells disposed on the same row of the memory array are connected to the corresponding word line, while the input/output nodes of the memory cells disposed on the same column of the memory array are connected to the corresponding data line. Though not particularly limited, the lines D0, $\overline{D0}$-D15, $\overline{D15}$ correspond to each bit of the sampling data stored in the RAM, or the like, and the word lines correspond to the addresses of the RAM.

A plurality of data lines comprising the M-ARY are connected to the corresponding unit sense amplifier circuits SA0-SA15 inside the SA and to the corresponding unit buffer circuits MDB0-MDB15 inside the MDB. The unit circuits MDB0-MDB15 of the MDB are connected to the corresponding unit selection circuits SEL00-SEL15 of the bus selection circuit SEL0. The timing signal $\phi_{SA}$ is supplied from the TG to the SA and the timing signals $\phi_w$ and $\phi_r$ are supplied to the MDB. The bus selection signal SO is supplied from the CTL to the bus selection circuit.

Each of the unit sense amplifier circuits SA0-SA15 has exactly the same circuit construction. The detailed circuit diagram of the unit sense amplifier SA0 is shown in the drawing. The unit sense amplifier circuit comprises a CMOS flip-flop circuit consisting of P-channel MOSFETs $Q_7$, $Q_9$ and N-channel MOSFETs $Q_8$, $Q_{10}$; a P-channel MOSFET $Q_{11}$ that is connected between the flip-flop circuit and the power supply $V_{cc}$; and an N-channel MOSFET $Q_{12}$ that is connected between the flip-flop circuit and the ground potential $V_{ss}$. The gate of MOSFET $Q_{11}$ is connected to the timing signal $\overline{\phi_{sa}}$ whose phase is the inverse of the timing signal $\phi_{sa}$. The gate of MOSFET 12 is connected to the timing signal $\phi_{sa}$. MOSFETs $Q_{11}$ and $Q_{12}$ are turned ON when the high level timing signal $\phi_{sa}$ and the low level timing signal $\overline{\phi_{sa}}$ are applied to the unit sense amplifier circuit and a potential difference between a pair of data lines $D_0$ and $\overline{D}_0$ which amplifies and stores the data bit in the CMOS flip-flop.

Each of the unit buffer circuits MDB0–MDB15 has exactly the same circuit construction, and the construction of only one unit buffer circuit MDB0 is shown in the drawing. The unit buffer circuit MDB0 consists of inverters IV1–IV5, though the construction is not particularly limitative. The circuit construction of the clocked inverter and that of the inverter are well known in the art and are therefore not shown in the drawing. However, the operation of the clocked inverter will be described next.

When the timing signal or described above is at the high level, each of the clocked inverters IV1 and IV2 generates an output signal which is inverse to the input signal. When $\phi_r$ is at the low level no output signal is generated since the inverter is in the high impedance output state. Similarly, each of the clocked inverters IV3 and IV5 generates an output signal which is the inverse of the input signal when the timing signal $\phi_w$ is at the high level and generates the high impedance output when the timing signal $\phi_w$ is at the low level.

In the unit buffer circuit, the clocked inverter IV1 is a dummy inverter which is inserted to equalize the parasitic capacitances between the data lines D0 and $\overline{D0}$, though this circuit arrangement is not particularly limited. In the read mode of the RAM, the timing signal $\phi_r$ described above is at the high level and the timing signal $\phi_w$ is at the low level. Accordingly, the data transferred from the memory cell to the data line is amplified by the unit sense amplifier circuit and sent to the unit selection circuit through the clocked inverter IV2 and then to the Y-BUS. In the write mode, the timing signal $\phi_w$ is at the high level while the timing signal $\phi_r$ is at the low level so that the data transferred from the D-BUS to the unit buffer circuit through the unit selection circuit is inverted by the clocked inverter IV5 for the data line $\overline{D0}$. Substantially simultaneously, the data from the D-BUS is inverted by both inverter IV4 and clocked inverter IV3 and is thereafter written into the selected memory cell from data line D0.

Each of the unit selection, circuits SEL00–SEL15 has essentially the same circuit construction, and only the circuit for unit selection circuit SEL00 is shown. The unit selection circuit consists of the inverter IV7 and the clocked inverter IV6. This arrangement transfers the data from the D-BUS to the RAM when the selection signal S0 is at the high level FIGS. 1 and 2 show that the D-BUS and the Y-BUS both consist of 16 signal lines each and each signal line is connected to a corresponding unit selection circuit.

The timing signal (sense amplifier activation signal) osa described above is normally at the low logic level. During the read mode of the RAM, $\phi_{sa}$ is at the high logic level when the selecting operation of the word line is complete. Similarly, the timing signal $\phi_r$ described above is normally at the low logic level, but goes to the high logic level when the amplifying operation of the read signal by the sense amplifier SA in the read mode of the RAM is complete. The timing signal $\phi_w$ is normally at the low logic level, but when the write mode of the RAM is selected it goes to the high logic level until the selecting operation of the word lines is complete. Though the bus selection signal S0 is normally at the low logic level, it changes to the high logic level when the RAM is in the write mode and under the selection state.

In FIG. 2, symbol L represents a load means on the data line. This load means comprises a resistance element consisting of a MOSFET or a precharge MOSFET which receives at its gate a precharge signal generated by the fundamental clock signal $\phi_0$ described already and whose source-drain path is connected between the power supply $V_{cc}$ and the line.

The precharge MOSFET consists of a P-channel MOSFET, through not particularly limited thereto, and is controlled by a precharge signal which is at the low level after the timing signal $\phi_0$ changes to the low level and is set to the high level when the timing signal $\phi_0$ rises to the high level. When the timing signal $\phi_0$ is at the low level, the data lines in the RAM are precharged. When the timing signal rises to the high level, the read/write operation and shift operation can be executed with the RAM. Therefore, the RAM can execute one of these operations within one memory cycle of the timing signal $\phi_0$.

Alternatively, the precharge MOSFET may also consist of an N-channel MOSFET. In such a case, however, a precharge signal whose phase is inversed to that of the precharge signal described above is used as the precharge signal.

The precharge signal for both embodiments can be generated easily by the timing signal $\phi_0$ described above.

Figure 3:
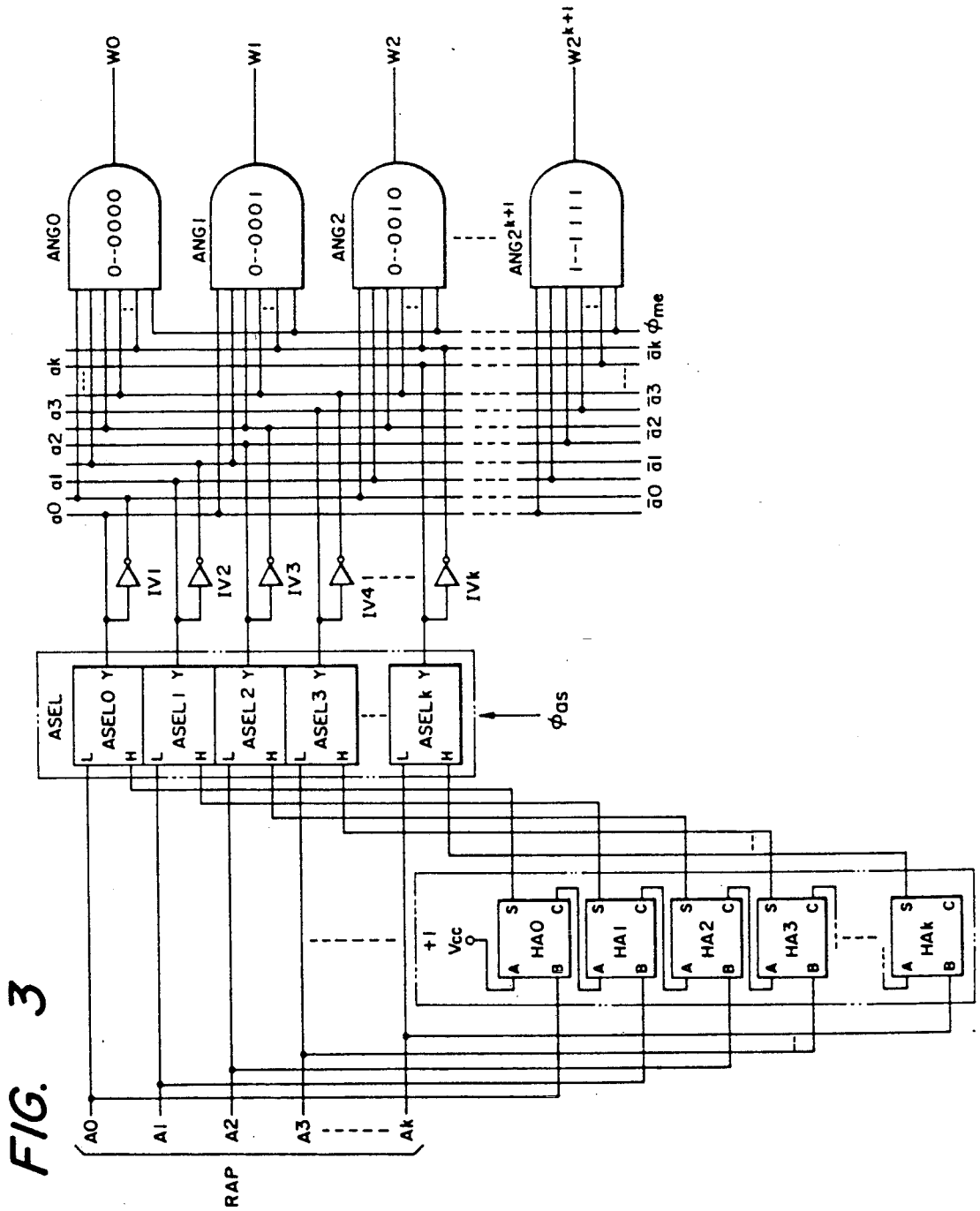
FIG. 3 is a circuit diagram showing in detail the address decoder DCR, address selection circuit ASLO and plus-one circuit of the RAM shown in FIG. 1.

FIG. 3 is a detailed view showing one example of the address decoder DCR, the address selection circuit ASL and the incrementing circuit +1 shown in FIG. 1.

In FIG. 3, the DCR comprises unit decoders ANG-0–ANG$_{2k+1}$ each consisting of an AND gate and the word lines W$_0$–W$_{2k+1}$ to which the outputs of these decoders are connected to the memory cells inside the memory array M-ARY. The k+1 bit non-inversed internal address signals a$_0$-a$_k$ and inversed internal address signals $\overline{a}_0$-$\overline{a}_k$ are supplied to the DCR through the ASL and the inverters IV$_l$-IV$_k$ while the timing signal $\phi_{me}$ is supplied from the TG.

The timing signal $\phi_{me}$ is normally at the low logic level and rises to the high logic level in one memory cycle period when the memory enable signal ME is at the high logic level and the RAM is selected.

In other words, the DCR decodes the complementary internal address signals a0-ak supplied from the ASL and selects one of the word lines during the period in which $\phi_{me}$ timing signal $\phi_{me}$ is at the high logic level.

The incrementing circuit +1 consists of half adders HA0–HAk in the following way. The carry output of the half adder HA0 is connected to one of the inputs A of the half adder HAI and the carry output C of the half adder HA1 is connected to one of the inputs A of the next half adder HA2. In the same way, the carry output C of the half adder HAk-1 is connected to one of the inputs A of the next half adder HAk, but the carry output C of the last half adder HAk is unconnected. The other input A of the half adder HA0 is connected to the power supply voltage $V_{cc}$. The k+1 bit address signals A0–Ak from the RAP are supplied to the incrementing circuit +1 and are connected to the other input terminals B of the corresponding half adders. Therefore, the incrementing circuit +1 generates the address signal which is the sum of each input address signal A0–Ak and 1. This address designates the address of the data access during the next sampling period. Each address thus generated is transferred to the unit address selection circuit ASEL0–ASELk in the address selection circuit ASEL from the output terminal of each half adder HA0–HAk. Thus, while the address signal which designates the memory to access during the present sampling period is active, the incrementing circuit +1 generates the address representing the memory cell to access during the next sampling period, and transmits this address signal to the ASEL.

The ASEL consists of unit address selection circuits ASEL0–ASELk each having the same circuit construction. The address signals A0–Ak outputted from the RAP are bits are supplied to the input terminals L of the unit address selection circuits ASEL0–ASELk, respectively. The address signals generated by the incrementng circuit +1 are similarly supplied to the other input terminal H of the unit address selection circuits ASEL0–ASELk. The timing sgnal $\phi_{as}$ is supplied to each unit address selection circuit ASEL0–ASELk. Each unit address selection circuit selects the address signal supplied to the input terminal L when $\phi_{as}$ is at one logic level and selects the signal at the input terminal H when $\phi_{as}$ is at the inverse logic level. This selected signal is output to the termnal Y. Thus, the ASEL supplies either the address signal representing the memory cell to access during the present sampling period or the address signal representing the memory cell to access during the next sampling period to the DCR.

The timing signal oas described above is normally at the low logic level in the read mode of the RAM and rises temporarily to the high logic level when the address shift mode signal SM is at the high logic level. This read operation of the sampling data normally occurs when the product/sum calculation associated with the filter calculation is computed during the latter half of the memory cycle.

When the timing signal $\phi_{as}$ is at the low logic level, the ASL selects the address signals A0–Ak supplied from the RAP and transmits them as the complementary internal address signals a0–ak to the DCR. When the timing signal $\phi_{as}$ is at the high logic level, the ASL selects the address signals supplied from the incrementing circuit +1 and transmits them as the complementary internal address signals a0–ak to the DCR. The address shift mode of RAM is selected when the timing signal $\phi_{as}$ rises to the high logic level. At that time the timing signal $\phi_{me}$ falls temporarily to the low logic level and the selecting operation of the word lines by the DCR is temporarily inhibited. This prevents a plurality of word lines from being selected simultaneously when the complementary internal address signals shift.

The sense amplifier SA is activated by the timing signal $\phi_{sa}$. The SA amplifies and temporarily stores the signals read from a plurality of memory cells connected to the selected word line through a plurality of corresponding data lines. These read signals are delivered to the Y-BUS through the MDB and the SELO. Incidentally, when the RAM is in the address shift mode, the read signal established on the sense amplifier SA and the data line is temporarily stored for the write operation made in the latter half of the memory cycle.

When the data in the RAM is accessed, the MDB is selected by the timing signal $\phi_w$ as described above. The data and its complement is supplied from the D-BUS through the SELO to each data line. In the read mode (including the address shift mode) the MDB is selected by the signal $\phi_r$. The read signals are amplified by the sense amplifier SA and delivered to the Y-BUS through the SELO.

FIGS. 4(a) to 4(e) are timing charts of the RAM shown in FIG. 1. In the embodiment shown in the drawings, the read mode of the RAM is represented by solid line and the write mode is represented by dotted lines. Each of these modes occur in the first porton of a memory cycle. The address shift mode of the RAM is carried out in the latter half of the memory cycle.

The memory cycle of the RAM of this embodiment is determined with the fundamental clock signal $\phi_0$ supplied from the CTL. The RAM is selected for a memory cycle when the memory enable signal ME rises to the high logic level before the rise of the signal $\phi_0$, though this arrangement is not particularly limitative. Substantially simultaneously with the rise of ME, the operation mode of the RAM is set to the address shift mode., read mode or write mode. The RAM mode is determined by the address shift mode signal SM and the read/write signal R/$\overline{W}$ logic levels.

In FIGS. 4(a) to 4(e), when the RAM is selected for a data read the signals ME and R/$\overline{W}$ are at the high logic level and signal SM is at the low logic level. The k+1 bit address signals AO–Ak are supplied to the RAM substantially simultaneously with the signal ME. The address signals AO–Ak, denoted as "h" in FIG. 4(e), designate the address of the memory cells to access in the RAM. Since the signals SM and $\phi_{as}$ are at the low logc level, the signals A0–Ak are selected by the ASL and are supplied as the complementary internal address signals a/ –ak to the address decoder DCR Since the signals ME and R/$\overline{W}$ are at the high logic level when the signal $\phi_0$ rises, the timing signal $\phi_{me}$ is raised to the high logic level by TG in the RAM. Subsequently, TG sequentially raises the timing signals $\phi_{sa}$ and $\phi_r$ to the high logic level.

When the signal $\phi_{me}$ rises to the high logic level, the DCR selects the one word line designated by the address signals AO–Ak, that is, the word line that corresponds to the address "h" is activated. When the signal $\phi_{sa}$ is at the high logic level, the sense amplifier SA operates and the read signals from a plurality of memory cells connected to the selected Word line are amplified by the corresponding unit sense amplifiers in the SA. Next, when the signal $\phi_r$ goes to the high logic level, the data read, denoted (h) in FIG. 4(l) from the RAM is delivered to the Y-BUS through the memory data buffer MDB and the bus selection circuit SELO.

The read operation of the RAM is complete when the memory enable signal ME falls to the low logic ievel before the rise of the fundamental clock $\phi_0$ of the next memory cycle, though this circuit arrangement is not particularly limitative. Each circuit of the RAM then enters the deselected state.

When the signal ME rises to the high logic level and substantially simultaneously the signal R/$\overline{W}$ falls to the low logic level $\phi_{as}$ the signal $\phi_0$ rises, the RAM enters the write mode. The word line is then selected by the address signals A0–Ak and the write data is supplied through the D-BUS, SELO and the MDB to a plurality of selected memory cells. At this time, the TG in the RAM raises the timing signal $\phi_w$ to the high logic level.

Figure 4:
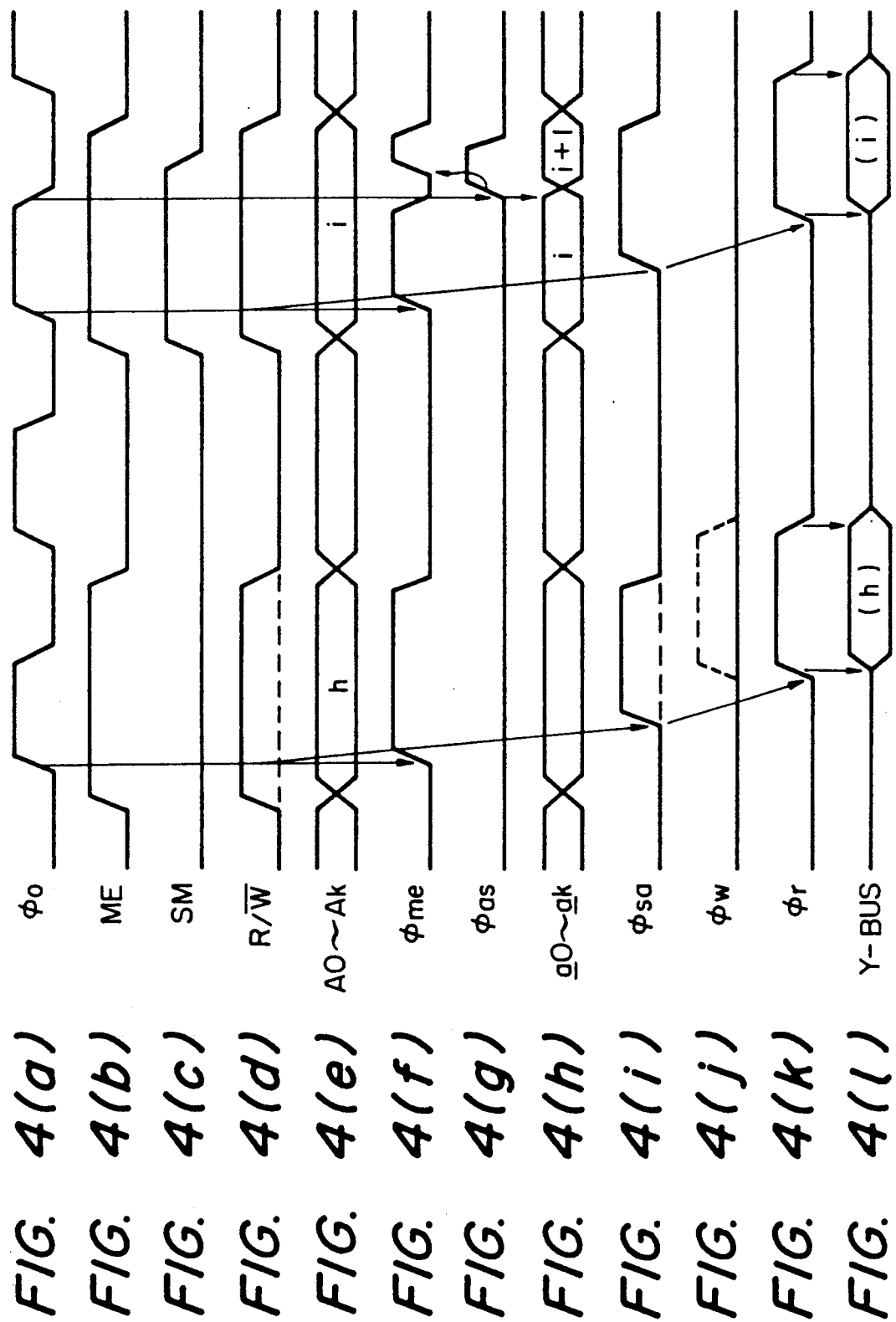
FIGS. 4(a), to 4(l) are timing charts of the RAM shown in FIG. 1.

The latter half of FIG. 4 shows when the signals ME and SM go to the high logic level before the signal $\phi_0$ rises, the RAM enters the address shift mode. The address signals AO-Ak are supplied together with the signal ME to the RAM as the signal R/$\overline{W}$ rises to the high logic level. The address signals AO-Ak, denoted "i" in FIG. 4(e), designate the address where the desired sampling data is stored.

Subsequently, the signal $\phi_{me}$ rises to the high logic level for a predetermined period during the memory cycle period and a little later, the timing signals $\phi_{sa}$ and or rise sequentially to the high logic level. Accordingly, the previously described read operation is accomplished and the data from a plurality of selected memory cells at the address "i", as denoted in FIG. 4(h), are delivered to the Y-BUS.

In the address shift mode TG raises the signal $\phi_{as}$ to the high logic level as the signal $\phi_0$ falls to the low logic level. This causes the ASL to select the output signal of the incrementing circuit +1, which is supplied as the complementary internal address signals $\overline{a0-ak}$ to the address decoder DCR. Just prior to the rise of $\phi_{as}$, the signal $\phi_{me}$ temporarily falls to the low logic level which inhibits DCR output. When the signal $\phi_{me}$ rises again the output of the incrementing circuit +1 is passed through the DCR to select a word line in the memory array. This address is denoted as "i+1" in FIG. 4(h). In other words, during the period in which the incremented address signal is passed through the ASL and the decoding operation by the DCR is inhibited the word lines are activated.

When the signal $\phi_{me}$ is again at the high logic level, the word line corresponding to the address "i+1" is selected. At this time, the read signal of the address "i" read in the former portion of the memory cycle is exerted on each data line by the SA. Therefore the sampling data, denoted (i) in FIG. 4(l), from the address "i" previously read is now written into the plurality of memory cells selected by the word line corresponding to "i+1". During the memory cycle the sampling data (i) was read from the address "i", outputted through the bus selection circuit SELO to the Y-BUS and was also written into the address "i+1" corresponding to the next sampling period, thereby shifting the sampling data.

The address shift operation described above is complete when the memory enable signal ME falls to the low logic level before the rising edge of the signal $\phi_0$ of the next memory cycle. When the signal ME falls to the low logic level each circuit in the RAM is deselected.

FIGS. 5(a) to 5(m) are timing charts of the RAM shown in FIG. 1. In this embodiment, there are shown the read, write and address shift modes of the RAM. The charts depict a series of these operational modes.

The first and second memory cycles are represented by $m_1$ and $m_2$ and the last memory oycle is depicted by $m_O$ in the charts. Though not particularly limited, the RAM is selected for a predetermined period within a memory cycle when the signal ME rises to the high logic level prior to the rise of the signal $\phi_0$.

Memory cycle $m_1$ is a read operation as previously depicted in FIGS. 4(a) to F(l). The signals ME and R/$\overline{W}$ are at the high logic level and the signal SM is at the low logic level. The k+1 bit address signals AO-Ak are supplied to the RAM substantially simultaneously with the signal ME. The address signals AO-Ak, denoted as "$X_n$" in FIG. 5(e), designate the address in the RAM where the desired data is stored. These address signals are selected by the ASL when the signals SM and $\phi_{as}$ are at the low logic level. The signals A0-Ak are supplied as the complementary internal address signals $\overline{a0-ak}$ to the DCR.

The $\overline{TG}$ in the RAM raises ome during the read memory cycle. The TG subsequently raises the signals $\phi_{sa}$ and $\phi_r$ to the high logic level. When $\phi_{me}$ rises to the high logic level, the DCR selects a word line designated by the address signals AO-Ak. The word line selected corresponds to the address "$X_n$" in FIG. 5(e). When the timing signal $\phi_{sa}$ rises to the high logic level, the SA operates and the read signals outputted from a plurality of memory cells connected to the selected word line to the corresponding data lines are amplified by the corresponding unit circuits of the SA. Next, when the timing signal $\phi_r$ rises to the high logic level, the data read, denoted as ($X_n$) in FIG. 5(e), from the address "$X_n$" that is amplified by the SA is delivered to the Y-BUS through the MDB and the SELO.

The read operation of the RAM is completed when the signals $\phi_{me}$ and $\phi_{sa}$ fall to the low logic level a little after the fall of the fundamental clock signal $\phi_0$ to the low logic level, though this arrangement is not particularly limitative. However, since the sgnal ME remains at the high logic level, the RAM stays selected and enters the next memory cycle.

Figure 5:
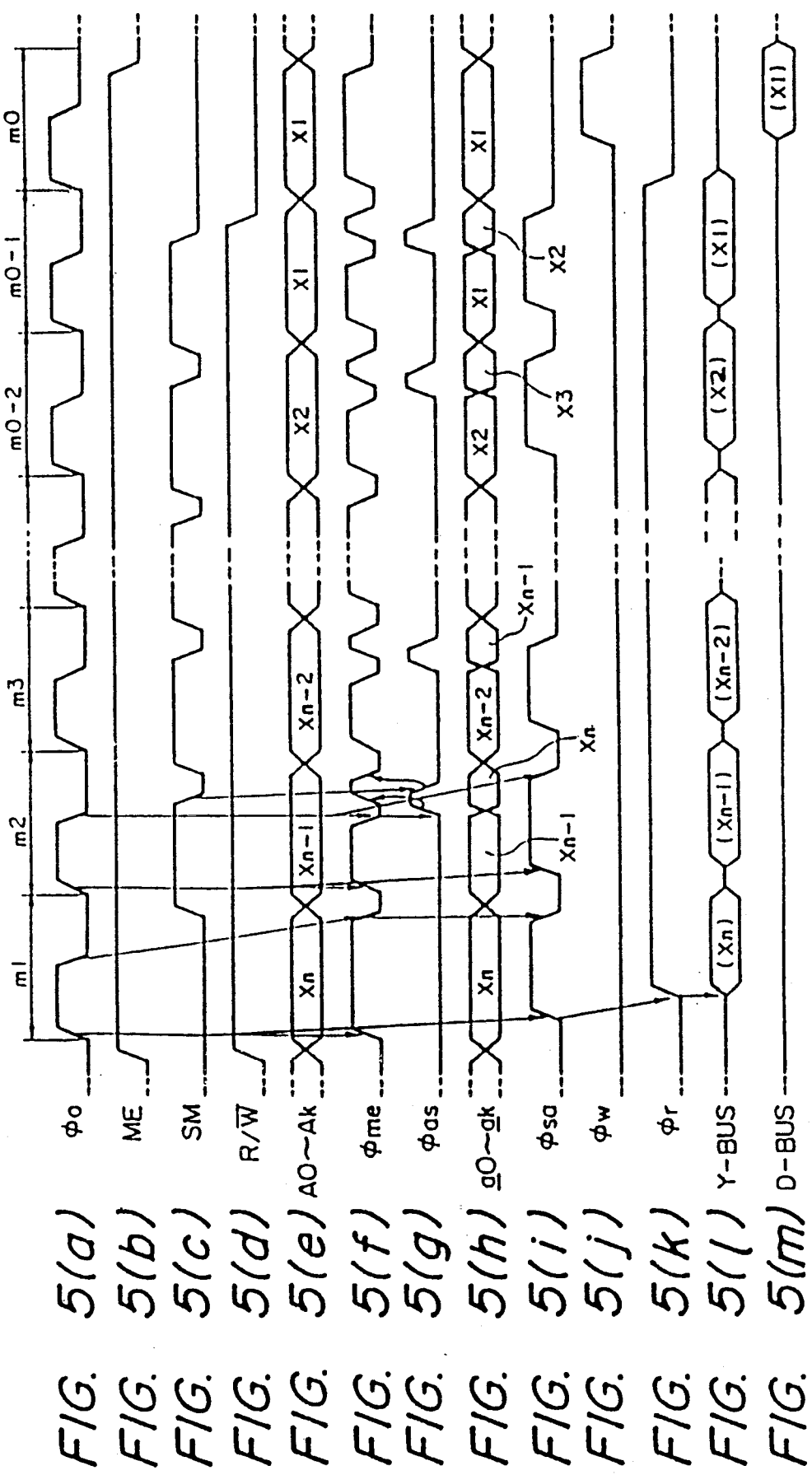
FIGS. 5(a) to 5(m) are timing charts of another example of the RAM shown in FIG. 1.

In the memory cycle $m_2$, the signal SM rises to the high logic level before the rising edge of the fundamental clock $\phi_0$ and the RAM enters the address shift mode as depicted in FIGS. 4(a) to 4(l). In the memory cycle $m_2$, the address signals AO-Ak from the RAP designate the address where the desired sampling data is stored. The address "$X_{n-1}$" depicted in FIG. 5(e) is one less than the address "$X_n$" which is designated in the memory cycle $m_1$.

Since the signal ME is at the high logic level at the rising edge of the signal $\phi_0$ the timing signal $\phi_{me}$ rises to the high logic level for a predetermined period within the memory cycle and a little later, the timing signal $\phi_{sa}$ rises to the high logic level. Since the timing signal $\phi_r$ remained at the high logic level from the memory cycle $m_1$, the read operation is performed as described above and the data ($X_{n-1}$), depicted in FIG. 5(l), is transferred from a plurality of memory cells at the address "$X_{n-1}$" to the Y-BUS.

When the signal $\phi_0$ falls to the low logic level, the timing signal $\phi_{as}$ rises to the high logic level in the RAM. Accordingly, the ASL selects the output of the incrementing circuit +1 which is the address signal "$X_n$" and supplies it as the complementary internal address signal $\overline{a0-ak}$ to the DCR. At this time, the signal $\phi_{me}$ falls temporarily to the low level before the rise of the signal $\phi_{as}$ to the high logic level. This inhibits the DCR from selecting a word line.

When the timing signal $\phi_{me}$ rises again to the high logic level, the word line corresponding to the address "$X_n$" is selected The data read from the address "$X_{n-1}$" during the former portion of the memory cycle has been maintained on the data line by the sense amplifier SA. Therefore, the sampling data ($X_{n-1}$) of the address "$X_{n-1}$" are written into the plurality of memory cells selected in the latter portion of the memory cycle which corresponds to the address "$X_n$". By this method the sampling data ($X_{n-1}$) is read from the address "$X_{n-1}$" through the bus selection circuit SELO and the Y-BUS for the product/sum calculation. The sampling data ($X_{n-1}$) is also written into the address "$X_n$". This effectively shifts the sampling data for the next sampling period.

The address shift operation described above is complete when the timing signal $\phi_{sa}$ falls to the low logic level a little after the fall of the signal $\phi_0$ to the low logic level. When the signal $\phi_{as}$ falls to the low logic level the signals SM and $\phi_{me}$ fall to the low logic level.

The address shift operation occurs in the memory cycle m3 in the same way as in the memory cycle m2 described above. The address signals AO-Ak for the RAP, denoted as "$X_{n-2}$" in FIG. 5(e), designate the address where desired sampling data are stored. The address "$X_{n-2}$" is one less than the address "$X_{n-1}$" which was desi.gnated in the memory cycle m2. The sampling data ($X_{n-2}$) is read from the address "$X_{n-2}$" to the Y-BUS and is also written into the address "$X_{n-1}$" for the next sampling period, thereby shifting the sampling data. The address shift operation is continued sequentially through the memory cycle $m_{n-1}$.

In the memory cycle $m_O$, the signal ME is at the high logic level at the rising edge of the signal $\phi_0$. The signals SM and R/W are at the low logic level and the RAM enters the write mode. In the memory cycle $m_O$, furthermore, the address signals AO-Ak from the RAP designate the address where to store the desired sampling data which is the address "$X_1$" designated in the memory cycle $m_{n-1}$. The TG raises the signal $\phi_{me}$ to the high logic level and a little later, the timing signal $\phi_w$ rises to the high logic level. Since the timing signal $\phi_{me}$ rises to the high logic level, the DCR selects the word line designated by the address signals AO-Ak which corresponds to the address "$X_1$". When the signal $\phi_w$ rises to the high logic level, the MDB amplifies the desred sampling data received through the SELO from the D-BUS and writes it into the address "$X_1$".

Though not particularly limited, the write operation of the RAM is complete when the signal ME falls to the low logic level before the start of the next memory cycle of the memory cycle $m_O$ and each circuit inside the RAM is deselected.

In FIGS. 5(a) to 5(m), the write operation to the specific address can be accomplished in the memory cycles $m_1$ to $m_O$, that is, after the read operation of the desired sampling and all the subsequent shift operations.

Figure 6:
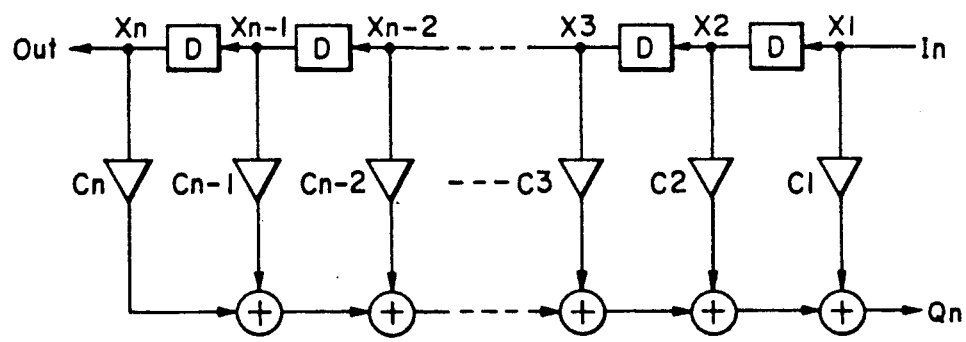
FIG. 6 is a block diagram showing one example of the filter calculation of the digital signal processor shown in FIG. 9.

FIG. 6 shows a process block diagram of the filter calculation in the digital signal processor of this embodiment. Though not particularly limited, the filter calculation shown in the drawing is performed by a transversal type digital filter.

In FIG. 6, the sampling data inputted from the input node in each sampling period is shifted after each sampling period by the delay circuit D and creates the sampling data X1-Xn at each node. Each sampling data X1-Xn are stored in the corresponding addresses of the RAM in the digital signal processor. Each filter coefficient C1-Cn is previously stored in the corresponding address of the ROM in the digital signal processor.

The sampling X1-Xn are read sequentially in a first-in first-out manner. The sampling data Xn is inputted to one of the input terminals of the multiplication circuit MULT through the bus selection circuit SELO and the Y-BUS. At substantially the same time, the corresponding filter coefficients C1-Cn are read from the ROM and nputted to the other input terminal of the MULT through the X-BUS and the SEL1. These sampling data and filter coefficients are multiplied together by the MULT and the resulting product is inputted to one of the input terminals of the ALU through the bus selection circuit SEL3. The content of the accumulator AC-CA·ACCB which is the result of the previous product/sum calculation, is inputted to the other input terminal of the ALU. The resulting sum is transferred to the accumulator ACCA·ACCB.

The product/sum calculation processing is repeated time-sequentially for the sampling data $X_n$ to X! and the filter calculation for one sampling period is expressed by the following equation:

$$Qn = \sum_{i=\phi}^{n-1} X_{n-1} \cdot C_{n-1} \qquad (1)$$

The reading of the RAM for each product/sum calculation is performed in the address shift mode and the storage address of each data sample is shifted by one sampling period. In this manner, the delay circuit D shown in FIG. 6 can be equivalently accomplished.

The filter calculation expressed by the formula (1) above is executed repeatedly for each sampling period and the signal formed as the result of such calculations are delivered to the outside through the external data buses DO-D15 and through the serial output terminal SO. In this manner, the digital signal processor of this embodiment equivalently functions as a 7 transversal type digital filter, for example.

In this embodiment, one data sample consists of 16 bits, though not particularly limited thereto, as can be seen from FIG. 2, and the data consisting of 16 bits are shifted into the next address by one shift operation.

Figure 7:
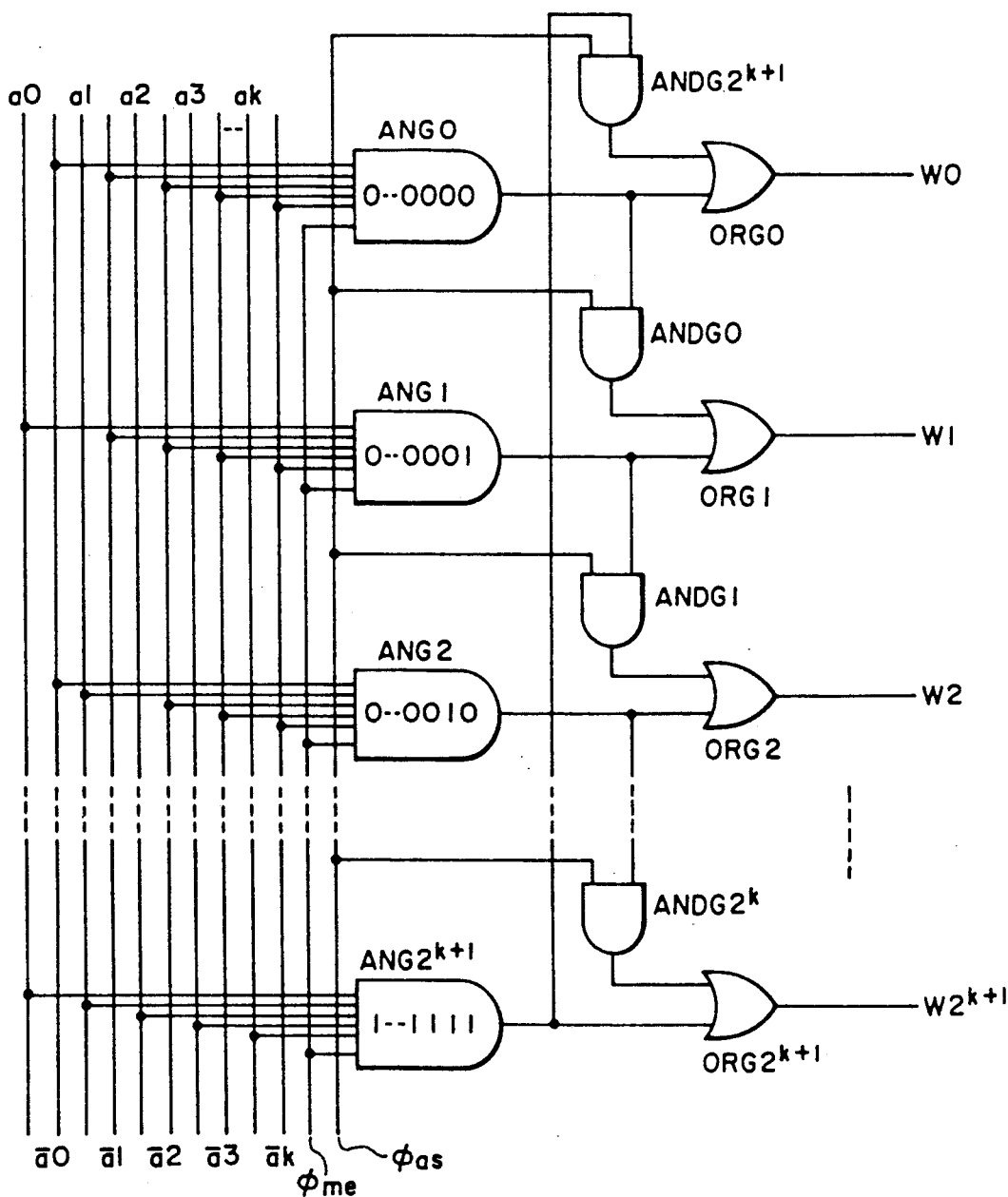
FIG. 7 is a circuit diagram showing in detail an example of the circuit which will substitute the address decoder DCR, address selection circuit ASL and plus-one circuit +1 of the RAM shown in FIG. 1.
Figure 8:
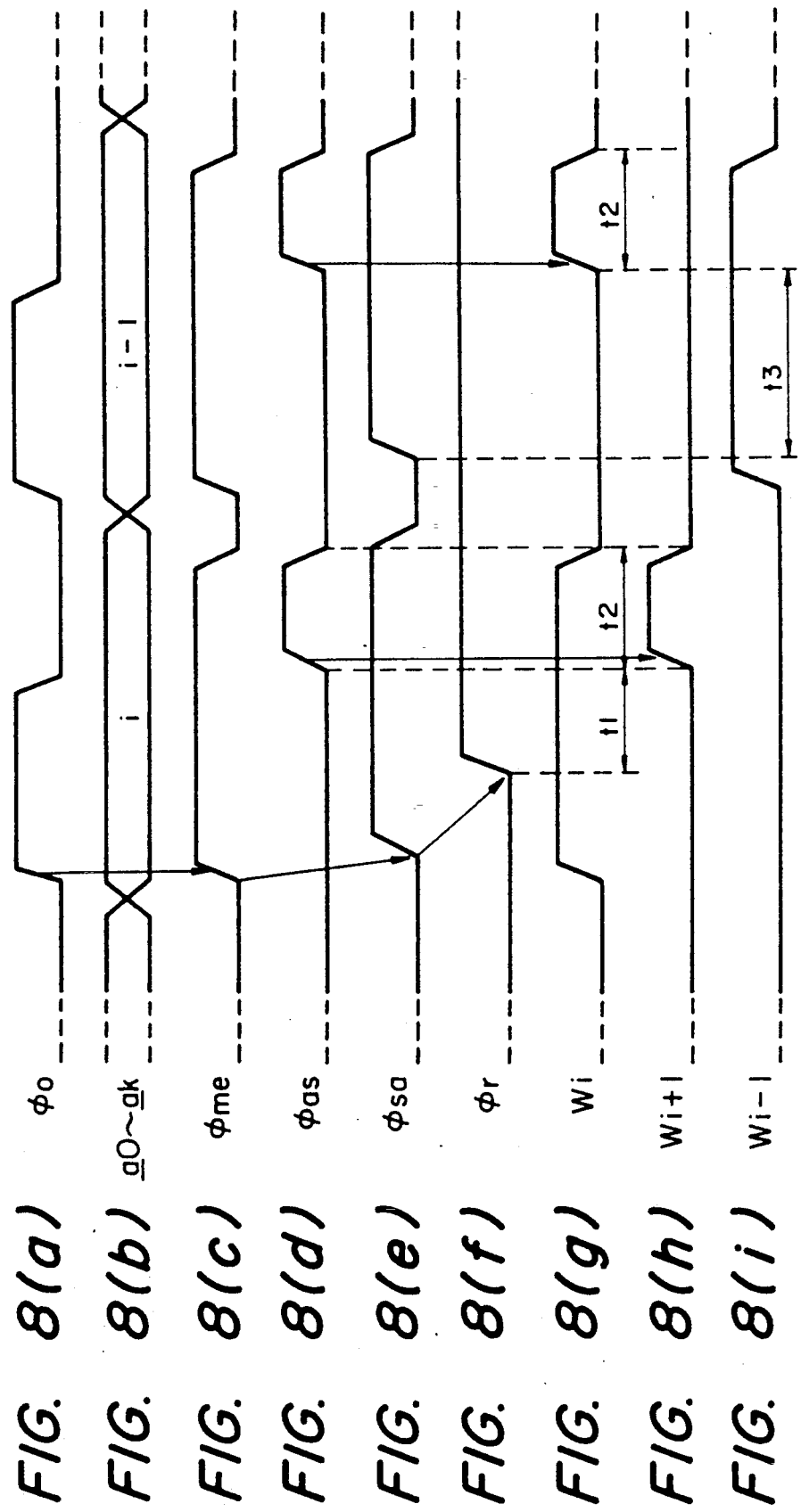
FIGS. 8(a) to 8(i) are timing charts showing one embodiment when the embodiment shown in FIG. 7 is applied to the RAM shown in FIG. 1.

FIG. 7 is a detailed view showing another embodiment of the address decoder DCR, address selection circuit ASL and the incrementing circuit +1 of the RAM shown in FIG. 1.

In FIG. 7, each of the AND gates ANG0-ANG$2^{k+1}$ is used as a unit decoder. The signal $\phi_{me}$ is supplied in common from the tming generation circuit TG to each of the AND gates ANG0-ANG$2^{k+1}$. The k+1 non-inversed internal address signals $a_0$-$a_k$. and the inversed internal address signals $\bar{a}_0$-$\bar{a}_k$ are also inputted to the AND gates ANG0-ANG$2^{k+1}$. Accordingly, one of the outputs of the AND gates ANG0-ANG$2^{k+1}$ rises to the high logic level to select one of the word lines W0-W$2^{k+1}$ which are the outputs of the OR gates ORG0-ORG$2^{+1}$. The output of each AND gate ANG-0-ANG$2^{k+1}$ is applied to one of the inputs of each OR gate ORG0-ORG$2^{k+1}$. The output of each of the corresponding AND gates ANDG1-ANDG$2^{k+1}$ is connected to the other input terminal of each OR gate ORG0-ORG$2^{k+1}$. The output of each OR gate ORG-0-ORG$2^{k+1}$ is connected to a plurality of memory cells inside the memory array M-ARY as the word lines W0-W$2^{k+1}$. The signal $\phi_{as}$ from the TG is supplied in common to the other input terminal of each of the AND gates ANG0-ANG$2^{k+1}$. The signal $\phi_{me}$ is normally at the low logic level. When the signal ME is at the high logic level and the RAM is selected, the signal $\phi_{me}$ rises to the high logic level for a predetermined period in one memory cycle.

Each unit decoder ANG0-ANG$2^{k+1}$ decodes the non-inversed internal address signal $a_0$-$a_k$ and the inversed internal address signal $a_0$-$a_k$ and selects the one word line designated by these address signals only for the period in which the signal $\phi_{me}$ is at the high logic level.

The signal $\phi_{as}$ is at the low logic level in the normal read or write mode of the RAM. When the signal SM is at the high logic level, which occurs when the read operation of the sampling data is made for the product-/sum calculation associated with the filter calculation, the signal $\phi_{as}$ rises temporarily to the high logic level in the latter portion of the memory cycle. At this time, the output of the OR gate corresponding to the next word line rises to the high logic level.

FIGS. 8(a) to 8(i) are timing charts showing the operations when the circuit shown n FIG. 7 is applied to the RAM. The embodiment shown in the drawings represents the address shift mode of the RAM.

In the RAM of this embodiment, the sgnal $\phi_{me}$ rises to the high logic level at the rising edge of the signal $\phi_0$ and a little bit later, the timing sgnals $\phi_{sa}$ and $\phi_{cr}$ rise sequentially to the high logic level. When the timing signal $\phi_{me}$ rises to the high logic level, the AND gates ANG$_0$-ANG$2^{k+1}$ of the unit decoder select one of the word lines and the data from a plurality of the memory cells connected to the selected word line Wi is delivered at the time $t_1$ to the Y-BUS through the bus selection circuit SELO.

When the signal $\phi_0$ falls to the low logic level, the timing signal $\phi_{as}$ rises to the high logic level in the RAM. Accordingly, the output signal of the AND gate ANDG$_i$ corresponding to the word line Wi rises to the high logic level and the word line Wi+1 is also selected. This means that while the signal $\phi_{as}$ is at the high logic level for the time $t_2$, both the word lines Wi and Wi+1 are selected simultaneously. As a consequence, the data of the memory cells on the previously selected word line Wi are amplified by the sense amplifier, read from the cells and then written into the memory cells of the second selected word line Wi+1. When the signal $\phi_{me}$ falls to the low logic level, the selecting operation of the word lines is complete.

The read operation and the address shift operation are performed in the next memory cycle in the same way as described above. Namely, when the signal $\phi_{me}$ rises to the high logic level at the rising edge of the signal $\phi_0$, the signal $\phi_{sa}$ rises a little later to the high logic level. The AND gates ANG$_0$-ANG$2^{k+1}$ of the unit decoder use the complementary address signals $a_0\bar{a}_0$-$a_k\bar{a}_k$ from the RAP which designate the address "i-1". This address is one less than the address "i" designated in the previous memory cycle. The data from the memory cells connected to the word line Wi−1 corresponding to the address "i−1" are delivered for the time $t_1$ to the Y-BUS through the bus selection circuit SELO. The timing signal $\phi_{as}$ rises to the high logic level at the falling edge of the signal $\phi_0$ to the low logic level, and the word lines Wi−1 and Wi are selected simultaneously for the time $t_2$. The data from a plurality of the memory cells connected to the word line Wi−1 are amplified by the sense amplifier SA, read from the cells and written into the plurality of the memory cells connected to the Word line Wi, thereby substantially accomplishing the shifting of the sampling data.

As described above, the digital signal processor of this embodiment computes the product/sum calculations for equivalently accomplishing a transversal type digital filter, for example. The embodiment also writes the sampling data read from the RAM into the address corresponding to the next sampling period during the present memory cycle. Accordingly, the sampling data necessary for the successive sampling period can be automatically shifted during the product/sum calcula- tions for the filter calculation. For this reason, the digital signal processor of this embodiment eliminates the program processing for shifting the sampling data, reduces the program size and does not need the hardware for holding the sampling data. Accordingly, the filter calculation speed of the digital signal processor can be improved and the cost of production lowered by reducing the number of necessary hardware components.

When the present invention is applied to the digital signal processor having the product/sum calculation function for the filter calculation as represented by the embodiment described above, the present invention provides the following effects: (1) The product/sum calculation necessary for the filter calculation is executed time-sequentially and after the sampling data is read from the RAM it is written automatically into the next address. In this manner, the read operation of the sampling data and the shift processing of the sampling data necessary for the filter processing can be accomplished substantially simultaneously. (2) Due to the effect of the item (1), the number of dynamic steps in the digital signal processor can be reduced and the load to the program processng can be lowered. Accordingly, the product/sum calculation processing necessary for the filter calculation can be quickened and the processing capacity of the digital signal processor improved. (3) The shift processing of the sampling data in item (1) does not require any delay registers for temporarily holding the sampling data or any program processing. Therefore, the hardware for the delay registers and instruction ROMs can be reduced and the cost of production of the digital signal processor can be lowered. (4) The write operation of the RAM in the shift processing of the sampling data in the item (1) can be executed without changing the level of the read signal established on the data lines and in the sense amplifier SA so that both the read operation of the sampling data and its shift processing can be accomplished during a single memory cycle at an increased speed. Accordingly, the machine cycle of the digital signal processor and its processing capacity can be improved further.

Though the present invention has been described in its preferred forms, the invention is not particularly limited thereto but can be changed or modified in various manners without departing from the spirit and scope thereof. For instance, though the shift processing of the sampling data is executed by automatically writing the sampling data read from the RAM into the next higher address in the digital signal processor of the embodiment described above, an arbitrary address can be designated by a separate program. In such a case, the executing direction of the product/sum calculation may be reversed time-sequentially by disposing two sets of memory areas for the sampling data, for example. In FIG. 2, the sampling data read from the RAM is outputted through the Y-BUS while the filter coefficients read from the ROM is outputted through the X-BUS. However, they may be outputted from the RAM and the ROM to both the X-BUS and Y-BUS, and the bus structure as well as its connection system are not particularly limited to the embodiment descrbed above. Furthermore, the definte circuit of the memory array M-ARY of the RAM, the sense amplifier SA and the memory buffer MDB that are shown in FIG. 2, the definite circuit of the address decoder DCR, and the like, shown in FIGS. 3 and 8, and the definite block construction of the RAM shown in FIG. 1 and the block construction of the digital signal processor and the combination of control signals that are shown in FIG. 9 may take various other forms. Additionally, though the description given above represents the case where the static type RAM is used as the RAM, the RAM may be comprised of dynamic RAM.

Though the foregoing description of the present invention is directed to a digital signal processor having the product/sum calculation function, the invention is not particularly limited thereto but can be applied to various digital signal processors having other product/sum calculation functions. In other words, the present invention can be applied widely to digital signal processors having at least the product/sum calculation function involving the shift processing and to digital apparatuses containing such digital signal processors.

What is claimed is:

1. A digital signal processor having a digital filter including a delay means for delay signal processing, said delay means comprising:
   a first memory means for storing first data;
   a second memory means for storing second data;
   a data line coupled to said first and second memory means and providing said first data to said second memory means;
   a first selecting line coupled to said first memory means;
   a second selecting line coupled to said second memory means;
   selecting means, coupled to said first and second selecting lines, for providing first and second selection signals to said first and second selecting lines; and,
   amplifier means, coupled to said data line, for reading said first data during a first time period in which said selecting means provides said first selecting signal to said first selecting line and for writing said first data into said second memory means during a second time period in which said selecting means provides said second selecting signal to said second selecting line, wherein said first time period overlaps said second time period.

2. The digital signal processor according to claim 1, wherein said selecting means further includes:
   decoder means coupled to said first and second selecting lines for decoding address signals;
   first address signal generating means coupled to said decoder means for providing the decoder means with a first address signal to select said first selecting line; and
   second address generating means, coupled to said decoder means and to said first address signal generating means, for providing the decoder means with a second address signal to select said second selecting line in response to the first address signal.

3. The digital signal processor according to claim 1, wherein said selecting means includes an address decoder coupled to said first and second selecting lines, a first address generating means coupled to said address decoder for generating a first address signal to indicate said first selecting line, and a second address generating means coupled to said address decoder and to said first address generating means for generating said second address signal to indicate said second selecting line responsive to said first address signal.

4. A digital filter comprising:
   a first memory means for storing first data;
   a second memory means for storing second data;
   a data line coupled to said first and second memory means and providing said first data to said second memory means;
   a data line coupled to said first and second memory means for providing said first data to said second memory;
   a first word line coupled to said first memory means for selecting said first memory means in response to a first selection signal;
   a second word line coupled to said second memory means for selecting said second memory means in response to a second selection signal;
   selection means coupled to said first and second word lines for generating said second selection signal subsequent to generating said first selection signal;
   a coefficient calculation means, coupled to said data line, for executing calculations between said first data and preselected coefficient data; and,
   amplifier means coupled to said data line, for reading said first data during a first time period in which said selection means provides said first selection signal to said first word line and for writing said first data into said second memory means during a second time period in which said selection means provides said second selection signal to said second word line, wherein said first time period overlaps said second time period.

5. The digital filter according to claim 4, wherein said selection means includes an address decoder coupled to said first and second word lines, a first address generating means coupled to said address decoder for generating a first address signal to indicate said first word line, and a second address generating means coupled to said address decoder and to said first address generating means for generating said second address signal to indicate said second word line responsive to said first address signal.

6. A digital signal processor comprising:
   instruction memory means for storing a plurality of instructions;
   control means, coupled to said instruction memory means, for generating control signals in accordance with an instruction provided from said instruction memory means; and
   data manipulation means, coupled to said control means and controlled by said control signals from said control means, wherein said data manipulation comprises:
   first memory means for storing first data;
   second memory means for storing second data;
   data line means coupled to said first and second memory means for providing said first data to said second memory means;
   a first word line coupled to said first memory means for selecting said first memory means in response to a first selection signal;
   a second word line coupled to said second memory means for selecting said second memory means in response to a second selection signal;
   selecting means, coupled to said first and second word lines and said control means, for generating said first and second selection signals delivered to said first and second word lines in accordance with said control signals from said control means; and,
   amplifier means, coupled to said data line, for reading said first data during a first time period in which said selecting means generates said first selection signal to said first word line and for writing said first data into said second memory means during a second time period in which said selecting means generates said second selection signal to said second word line, wherein said first time period overlaps said second time period and wherein said amplifier means is further coupled to said control means and is further controlled by said instruction provided from the instruction memory means.

7. The digital signal processor according to claim 6, wherein said selecting means includes an address decoder coupled to said first and second word lines, a first address generating means coupled to said address decoder for generating a first address signal to indicate said first word line, and a second address generating means coupled to said address decoder and to said first address generating means for generating a second address signal to indicate said second word line responsive to said first address signal.

8. In a digital signal processor having instruction memory means for storing a plurality of instructions, control means coupled to said instruction memory means for generating a control signal in accordance with an instruction provided from said instruction memory means and memory means comprising:

first memory means for storing first data;
second memory means for storing second data;
a data line coupled to said first and second memory means;
a first word line coupled to said first memory means;
a second word line coupled to said second memory means;
selecting means, coupled to said first and second word lines and to said control means, for generating a first and second selection signal; and,
amplifier means coupled to said data line, a method for controlling said memory means comprising the steps of:
selecting said first word line by generating said first selection signal from said selecting means in accordance with said control signal from said control means;
reading said first data from the first memory means by said amplifier means during a first time period in which said first selection siganl is generated from said selecting means;
selecting said second word line by generating said second selection signal from said selecting means in accordance with said control signal from said control means; and,
writing said first data into said second memory means by said amplifier means during a second time period in which said second selection signal is generated from said selecting means, wherein said first time period is at least partly concurrent with said second time period.

9. The method of claim 8, wherien said reading step further includes:
reading said first data from said first memory means;
providing said first data to an internal bus; and,
providing said first data to an arithmetic logic unit.

* * * * *

UNITED STATES PATENT AND TRADEMARK OFFICE
CERTIFICATE OF CORRECTION

PATENT NO. : 5,047,972

DATED : September 10, 1991

INVENTOR(S) : Hirohumi Wada

It is certified that error appears in the above-identified patent and that said Letters Patent is hereby corrected as shown below:

Claim 4, column 18, delete lines 1-3 which read as follows:
"a data line coupled to said first and second memory
means and providing said first data to said second
memory means;"

Claim 8, column 20, line 15, delete "siganl" and insert therefor
--signal--.

Signed and Sealed this

Fifteenth Day of December, 1992

*Attest:*

DOUGLAS B. COMER

*Attesting Officer*  Acting Commissioner of Patents and Trademarks